United States Patent
Roettger et al.

(10) Patent No.: US 11,075,070 B2
(45) Date of Patent: Jul. 27, 2021

(54) MONOCRYSTALLINE SEMICONDUCTOR WAFER AND METHOD FOR PRODUCING A SEMICONDUCTOR WAFER

(71) Applicant: SILTRONIC AG, Munich (DE)

(72) Inventors: Klaus Roettger, Bachmehring (DE); Herbert Becker, Burghausen (DE); Leszek Mistur, Burghausen (DE); Andreas Muehe, Wetzlar (DE)

(73) Assignee: SILTRONIC AG, Munich (DE)

( * ) Notice: Subject to any disclaimer, the term of this patent is extended or adjusted under 35 U.S.C. 154(b) by 351 days.

(21) Appl. No.: 15/777,859

(22) PCT Filed: Dec. 2, 2016

(86) PCT No.: PCT/EP2016/079524
§ 371 (c)(1),
(2) Date: May 21, 2018

(87) PCT Pub. No.: WO2017/097670
PCT Pub. Date: Jun. 15, 2017

(65) Prior Publication Data
US 2018/0342383 A1    Nov. 29, 2018

(30) Foreign Application Priority Data

Dec. 11, 2015    (DE) ............... 10 2015 224 933.6

(51) Int. Cl.
*H01L 21/02* (2006.01)
*H01L 21/304* (2006.01)
(Continued)

(52) U.S. Cl.
CPC .. *H01L 21/02013* (2013.01); *H01L 21/02016* (2013.01); *H01L 21/02019* (2013.01);
(Continued)

(58) Field of Classification Search
CPC ......... H01L 29/00; H01L 29/02; H01L 29/04; H01L 29/06; H01L 29/0657;
(Continued)

(56) References Cited

U.S. PATENT DOCUMENTS

| 5,980,361 A | 11/1999 | Mueller et al. |
| 2001/0018271 A1 | 8/2001 | Yanagisawa |

(Continued)

FOREIGN PATENT DOCUMENTS

| DE | 10 2013 201 663 A1 | 6/2014 |
| EP | 0 798 766 A1 | 10/1997 |

(Continued)

OTHER PUBLICATIONS

E. Sohn, et al. "New Results in Hydrodynamic Radial Polishing Using HyDRa," SPIE—International Society for Optical Engineering. Aug. 2005, XP055341195. 8 Pages.

*Primary Examiner* — Maria V Ewald
*Assistant Examiner* — Ethan A. Utt
(74) *Attorney, Agent, or Firm* — Brooks Kushman P.C.

(57) ABSTRACT

A monocrystalline semiconductor wafers have an average roughness $R_a$ of at most 0.8 nm at a limiting wavelength of 250 μm, and an $ESFQR_{avg}$ of 8 nm or less given an edge exclusion of 1 mm. The wafers are advantageously produced by a method comprising the following steps in the indicated order:

a) simultaneous double-side polishing of the semiconductor wafer,
b) local material-removing processing of at least one part of at least one side of the semiconductor wafer using a fluid jet which contains suspended hard substance particles and which is directed onto a small region of the surface with the aid of a nozzle, wherein the nozzle is moved over that part of the surface which is to be (Continued)

treated in such a way that a predefined geometry parameter of the semiconductor wafer is improved, and
c) polishing of the at least one surface of the semiconductor wafer.

18 Claims, 1 Drawing Sheet

(51) Int. Cl.
  *H01L 21/66* (2006.01)
  *H01L 29/16* (2006.01)
  *H01L 21/306* (2006.01)
  *H01L 21/67* (2006.01)

(52) U.S. Cl.
  CPC .. *H01L 21/02021* (2013.01); *H01L 21/02024* (2013.01); *H01L 21/02052* (2013.01); *H01L 21/3046* (2013.01); *H01L 21/30625* (2013.01); *H01L 21/67051* (2013.01); *H01L 22/12* (2013.01); *H01L 22/20* (2013.01); *H01L 29/16* (2013.01)

(58) Field of Classification Search
  CPC ..... H01L 29/0665; H01L 29/12; H01L 29/16; H01L 29/167; H01L 29/30; H01L 29/32; H01L 29/34; H01L 29/36; Y10T 428/24355
  USPC .................................. 257/618; 428/141, 220
  See application file for complete search history.

(56) References Cited

U.S. PATENT DOCUMENTS

| | | |
|---|---|---|
| 2003/0096562 A1 | 5/2003 | Kurogouchi |
| 2004/0072512 A1 | 4/2004 | Kimura et al. |
| 2008/0119133 A1 | 5/2008 | Fahnle |
| 2010/0056027 A1 | 3/2010 | Zapilko et al. |
| 2010/0104806 A1 | 4/2010 | Schwandner |
| 2010/0224964 A1 | 9/2010 | Passek et al. |
| 2012/0149198 A1* | 6/2012 | Schwandner ..... H01L 21/02008 438/693 |
| 2013/0137244 A1* | 5/2013 | Kramer ............ H01L 21/02381 438/478 |
| 2014/0103492 A1* | 4/2014 | Fusegawa ............... C30B 29/06 257/617 |
| 2014/0141613 A1* | 5/2014 | Heilmaier ........ H01L 21/02024 438/693 |
| 2014/0206261 A1 | 7/2014 | Roettger et al. |
| 2015/0162181 A1 | 6/2015 | Yamashita |
| 2017/0117228 A1* | 4/2017 | Schauer ............ H01L 21/02634 |

FOREIGN PATENT DOCUMENTS

| | | |
|---|---|---|
| EP | 0 847 835 A1 | 6/1998 |
| JP | 2005117014 A | 4/2005 |
| JP | 2012-000714 A | 1/2012 |
| KR | 10-2010-0100613 | 9/2010 |
| WO | 02/074489 A1 | 9/2002 |

* cited by examiner

MONOCRYSTALLINE SEMICONDUCTOR WAFER AND METHOD FOR PRODUCING A SEMICONDUCTOR WAFER

CROSS REFERENCE TO RELATED APPLICATIONS

This application is the U.S. National Phase of PCT Appln. No. PCT/EP2016/079524 filed Dec. 2, 2016, which claims priority to German Application No. 10 2015 224 933.6 filed Dec. 11, 2015, the disclosures of which are incorporated in their entirety by reference herein.

BACKGROUND OF THE INVENTION

1. Field of the Invention

The invention relates to a monocrystalline semiconductor wafer having a low roughness $R_a$ and an outstanding flatness in a region adjoining the edge. The invention also relates to a multi-stage method suitable for producing such semiconductor wafers.

2. Description of the Related Art

Monocrystalline semiconductor wafers, e.g. silicon wafers, which are used for the production of electronic components, must have an extremely flat surface. Otherwise the structures in the nanometer range cannot be imaged sharply on the surface during photolithography. The requirements with regard to flatness constantly increase on account of the miniaturization of the electronic components that is advancing ever further. In this case, that region of the silicon wafer which directly adjoins the edge can be leveled with particular difficulty on account of a wide variety of effects. Double-side polishing is a suitable method for achieving extremely flat silicon wafers having good local geometry values in the edge region in mass production. By way of example, given an edge exclusion of 1 mm an $ESFQR_{avg}$ of approximately 30 nm can be achieved. The parameter ESFQR and its determination are defined in the SEMI standard M67-1108. This involves a local flatness value determined on measurement fields arranged radially at the edge of the silicon wafer. The average value of the ESFQR values of all the measurement fields of a silicon wafer is abbreviated to $ESFQR_{avg}$.

However, it is very difficult for the flatness at the edge also to be improved significantly by means of double-side polishing, since various influencing variables such as the flowing of the polishing slurry against the edge and the depression of the polishing pad lead to unavoidable faults. Through suitable selection of process implementation and auxiliaries, it is indeed possible to set the global profile of the processed semiconductor wafer relatively freely from convex to concave. Nevertheless, even with a concave shape overall, it is not possible to avoid a decrease in thickness directly adjoining the wafer edge. The latter directly influences the achievable ESFQR values.

Owing to the limitations associated with double-side polishing, a method was developed which makes it possible to improve the flatness of the silicon wafers in a targeted manner and locally. This involves the PACE method ("Plasma Assisted Chemical Etching"). In this case, a plasma etching head a few millimeters in size is guided over the wafer surface at a defined speed, wherein the material removal at a specific position is determined by the residence time of the plasma etching head at the relevant location, i.e. by the speed of the head.

EP0798766A1 describes the use of PACE for improving flatness. In this case, after mechanical processing, a semiconductor wafer is firstly polished and then its thickness distribution is measured. On the basis of the results of the location-dependent thickness measurement, the wafer is subsequently subjected to the PACE method, wherein the latter is controlled such that more material is removed at thicker locations than at thinner locations, such that local thickness differences are compensated for. The wafer is then subjected to a haze-free polishing in order to eliminate the roughness and disturbances of the crystal lattice (so-called "damage") caused by the PACE step.

Since roughness and damage after PACE are comparatively high, a large amount of material, for example 3 µm, has to be removed during the subsequent haze-free polishing in order to remove roughness and damage. This is in turn associated with an unavoidable deterioration in the flatness in the outermost edge region of the wafer, such that an arbitrarily good flatness in the edge region cannot be achieved even by means of PACE. Moreover, haze-free polishing, which is always carried out as single-side polishing, cannot in principle achieve good leveling of longer-wave roughnesses (e.g. having a limiting wavelength of 250 µm), particularly if soft haze-free polishing pads are used.

The stated object of the invention arose from the problem described.

SUMMARY OF THE INVENTION

An object of the invention is to provide a monocrystalline semiconductor wafer having an average roughness $R_a$ of at most 0.8 nm at a limiting wavelength of 250 µm, characterized by an $ESFQR_{avg}$ of 8 nm or less given an edge exclusion of 1 mm, and to provide a method for producing a monocrystalline semiconductor wafer, comprising the following steps in the indicated order:

simultaneous double-side polishing of the semiconductor wafer, local material-removing processing of at least one part of at least one surface of the semiconductor wafer using a fluid jet which contains suspended hard substance particles and which is directed onto a small region of the surface with the aid of a nozzle, wherein the nozzle is moved over that part of the surface which is to be treated in such a way that a predefined geometry parameter of the semiconductor wafer is improved, and polishing of the at least one surface of the semiconductor wafer.

DETAILED DESCRIPTION OF THE PREFERRED EMBODIMENTS

Figure 1:
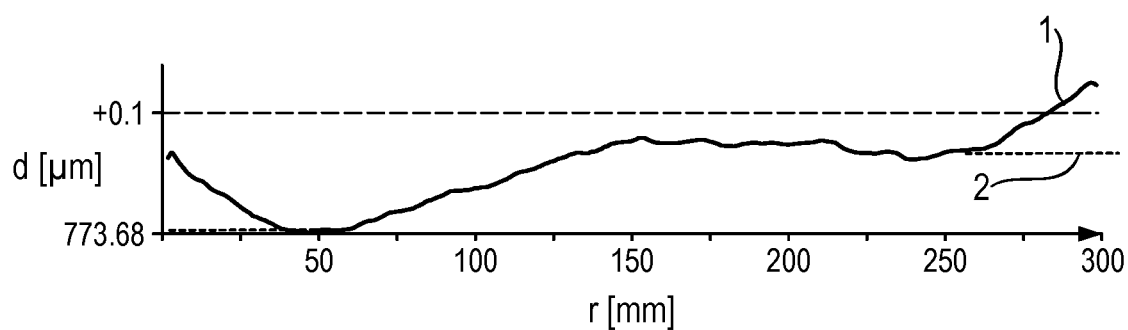
FIG. 1 shows a preferred radial profile of the front side of a semiconductor wafer, the profile being produced by means of simultaneous double-side polishing, and also a profile produced therefrom by means of subsequent FJP processing.

The method according to the invention uses the technique of "Fluid Jet Polishing" (FJP), which is known for the processing of optical glasses, in order to considerably improve the flatness of monocrystalline semiconductor wafers. In contrast to monocrystalline semiconductor wafers, glasses are amorphous solids which do not have an ordered crystal lattice. Disturbances of a crystal lattice structure resulting from the action of the hard substance particles impinging at high speed on the surface to be processed cannot occur in the case of amorphous materials, in contrast to crystalline materials. Surprisingly, however, FJP does not lead to relatively deep crystal lattice damage even in the case of monocrystalline semiconductor wafers. Therefore, it suffices to subject that side of the semiconductor wafer which has been treated by means of FJP to a short haze-free polishing with little material removal, in order to obtain a uniform low roughness and a surface free of damage. The small removal during the haze-free polishing ensures that the flatness as far as the outermost edge that is achieved by means of FJP is impaired only insignificantly by the haze-free polishing.

Consequently, the method according to the invention makes it possible for the first time to produce semiconductor wafers as described herein, which on the one hand have a low roughness typical of polished semiconductor wafers, but on the other hand simultaneously have a flatness as far as the outermost edge that is not achievable by polishing. Even the use of PACE does not lead to this combination of properties.

The method according to the invention leads directly to a semiconductor wafer as described herein. Preferably, the semiconductor wafer thus has a polished surface without an epitaxial layer deposited thereon. If an epitaxial layer is subsequently deposited, the flatness at the edge can be improved again (slightly) by means of a suitable process implementation. Therefore, the semiconductor wafer according to the invention is also suitable as a substrate for the production of an epitaxially coated semiconductor wafer having outstanding flatness in the edge region.

List of Reference Signs Used in the Figures:
1 radial profile of a semiconductor wafer after DSP and before FJP
2 radial profile of a semiconductor wafer after FJP The semiconductor wafer according to the invention is distinguished by a roughness $R_a$ ("average roughness") of 0.8 nm or less, preferably 0.5 nm or less, as is typical of polished semiconductor wafers. The indicated value relates to the average roughness with a limiting wavelength of 250 µm, determined by white light interferometry. At the same time, however, the semiconductor wafer according to the invention has a value $ESFQR_{avg}$—characterizing the flatness in the edge region—of 8 nm or less, preferably of 5 nm or less. By means of haze-free polishing in accordance with the prior art, it is possible to achieve a roughness $R_a$ of down to 0.2 nm or even 0.1 nm.

Thus, a semiconductor wafer according to the invention is considerably less rough than after PACE processing. On the other hand, at the edge, it is significantly flatter than after double- and single-side polishing in accordance with the prior art.

Preferably, a semiconductor wafer according to the invention has a content—determined by means of the poly-UTP method—of at most $3 \times 10^{10}$ $cm^{-2}$, preferably of at most $1 \times 10^{10}$ $cm^{-2}$, for each of the two elements copper and nickel. The poly-UTP method is described in the following paragraph. Such low metal concentrations cannot be achieved if processing is carried out by means of PACE. PACE leads to a contamination of the semiconductor wafer with metals such as copper and nickel, which, on account of the high diffusion rate of these metals, is not restricted to the surface of the wafer and therefore cannot be removed by suitable cleaning either.

The poly-UTP method is a method for simultaneously detecting both bulk metals and surface metals. The recovery rate is extremely high. The method is particularly suitable for detecting primarily rapidly diffusing elements such as copper and nickel. In a quartz tube reactor, a polycrystalline silicon layer having a thickness of approximately 1 µm is deposited as external getter on both sides of a silicon wafer to be analyzed. In the course of a further thermal treatment, copper and nickel diffuse from the bulk almost quantitatively to the interface between mono- and polycrystalline silicon. After cooling, the polycrystalline silicon layer is etched away wet-chemically. The etching solution is then evaporated, the residues are redissolved in a mixture of $HF/HNO_3$ and dissolved in ultrapure water. The concentrations impurities dissolved in this solution therein are finally determined by means of ICP-MS ("inductively coupled plasma mass spectrometry"). The total amount of each individual metal is indicated in the unit of atoms per square centimeter ($cm^{-2}$).

The semiconductor wafer according to the invention preferably substantially, i.e. to the extent of 90% (relative to the amount of substance) or more, consists of silicon. It preferably has a circular shape having a diameter of at least 300 mm, even greater diameters of up to 450 mm, for example, also being possible.

One possibility for producing such semiconductor wafers is afforded by the method described in greater detail below:

Preferably, a semiconductor wafer in accordance with the prior art is first produced. For this purpose, generally a single crystal is sliced into wafers (preferably by means of a multiwire saw, MWS). The semiconductor wafers are then processed mechanically (by lapping or grinding or a combination thereof) and chemically (acidic or alkaline etching or a combination thereof).

According to the invention, both sides of the semiconductor wafer thus produced are simultaneously subjected to chemical mechanical polishing. This method step is also known as double-side polishing (DSP) and described, for example, in DE102013201663A1. Preferably, the double-side polishing is associated with an overall material removal of 1 to 20 µm, more preferably 2 to 12 µm. This indicates the sum of the material removal on both sides of the semiconductor wafer, i.e. the resulting decrease in thickness. After the double-side polishing, the surface of the semiconductor wafer preferably has an average roughness $R_a$ of 0.01 to 0.1 nm at a limiting wavelength of 10 µm and of 0.07 to 0.7 nm at a limiting wavelength of 250 µm.

After double-side polishing has been carried out, the flatness of the semiconductor wafer is improved according to the invention by means of the FJP method. For this purpose, firstly the geometry parameter to be optimized should be defined; secondly, the geometry of the semiconductor wafer after the double-side polishing must be known.

For describing the geometry of a semiconductor wafer there exists a large selection of parameters which are defined for the entire semiconductor wafer or for individual sites and differ moreover in how the reference plane for the flatness measurement is defined and how the value of the parameter is calculated from the deviations from this reference plane. What parameter is used as particularly meaningful depends, inter alia, on the subsequent process for producing electronic components and the individual steps thereof. Particularly common geometry parameters are, for example, the parameter GBIR (a global flatness parameter with a reference plane defined by the backside of the semiconductor wafer) and SFQR (a local, site-referenced flatness parameter with a reference plane defined by the front side). A special case is the parameter ESFQR, which is defined in a manner similar to the parameter SFQR, but with radial arrangement of the measurement fields and in a manner restricted to the edge region of the semiconductor wafer. The parameters mentioned are defined in SEMI standards, the ESFQR in the SEMI standard M67-1108. The cited SEMI standard proposes measurement fields having a radial length of 30 mm for the ESFQR. The width of the measurement fields results from a uniform division into 72 sectors of equal size. All ESFQR and $ESFQR_{avg}$ values in this description relate to this measurement field definition taking account of an edge exclusion of 1 mm.

In principle, the FJP method can be used for optimizing the geometry of the semiconductor wafer with regard to any arbitrary geometry parameter. If a semiconductor wafer as described herein as having, for example, a surface roughness $R_a$ of 0.8 nm at a limiting wavelength of 250 nm and an ESFQRave of less than 8 nm with a 1 mm edge exclusion is intended to be produced, for example, then the parameter ESFQR should be used for optimization.

The second prerequisite for the geometry optimization by means of the FJP method is that the geometry of the semiconductor wafer after the double-side polishing is known. For this purpose, there are two possibilities which can be used for the method according to the invention:

a) After the simultaneous double-side polishing of each semiconductor wafer, the geometry thereof is measured. This individual measurement is taken as a basis for determining how much material must be removed by means of FJP and at what location of the semiconductor wafer in order to improve the predefined geometry parameter to the desired value.

b) If the double-side polishing yields a very highly reproducible result with regard to the geometry of the polished semiconductor wafers, a geometry measurement of each individual semiconductor wafer can also be dispensed with. In this case, it may suffice to calculate the location-dependent material removals for the subsequent FJP method on the basis of data that were obtained from measurements of semiconductor wafers produced in the same way, for example by averaging over a specific number of measured samples.

In the next step of the method according to the invention, at least one surface of the semiconductor wafer (generally the surface on which electronic components are produced later) is processed by the FJP method. The FJP method, as a local processing method, is able to remove different amounts of material depending on the position on that surface of the semiconductor wafer which is to be processed, and thus to improve the geometry proceeding from the known geometry after the double-side polishing.

The FJP method is a local material-removing processing using a polishing agent jet. The polishing agent consists of a fluid in which hard substance particles are suspended. The jet is directed onto a small region of the surface with the aid of a nozzle. The nozzle is moved over that part of the surface which is to be treated, wherein the nozzle itself or the semiconductor wafer or both in suitable combination can be moved. By way of example, a rotation of the semiconductor wafer can advantageously be combined with a linear movement of the nozzle. The relative movement of the nozzle in relation to the semiconductor wafer can be effected for example in parallel, straight lines (line by line), spirally or on circular paths parallel to the edge of the semiconductor wafer. A region to be processed can be swept over in each case only once or else multiply or with an overlap.

The location-dependent material removal can preferably be controlled by means of the residence duration of the nozzle at a location, i.e. by way of the speed at which the nozzle is moved over the surface of the semiconductor wafer at the location. A comparatively high material removal is effected at low speed of the nozzle, and vice versa. Preferably, the movement of the nozzle is controlled on the basis of the present geometry of the semiconductor wafer after the double-side polishing such that local elevations affecting the geometry parameter to be optimized are removed. The geometry of the semiconductor wafer with regard to the relevant parameter is improved in this way.

Preferably, for the method according to the invention, use is made of a variant of the FJP method which is described for example in WO02/074489A1 and in which the nozzle through which the polishing agent jet emerges is guided over the surface to be processed at a distance of 0.5 to 3 mm, preferably 0.7 to 2 mm, such that an annular gap arises between the end side of the nozzle and the processed surface. The nozzle preferably has a diameter of 4 to 8 mm. The surface area of the annular gap is smaller than the cross-sectional area of the inlet through which the polishing agent flows into the nozzle. The polishing agent accumulates between the nozzle and the surface to be processed and flows predominantly parallel to the surface to be processed through the annular gap substantially radially toward the outside. In this variant, the material removal is predominantly achieved by means of the fluid with suspended hard substance particles that flows radially toward the outside, specifically in a manner spatially delimited to the region of the annular gap, whereas no material removal takes place in the region of the center of the nozzle.

An alternative variant of the FJP method achieves a horizontal speed component of the polishing agent through a nozzle arranged obliquely with respect to the polishing surface. This affords the advantage that an increase in the surface roughness as a result of the small material removal in the region of the center of the nozzle in the variant described above is avoided. What is disadvantageous, by contrast, is the loss of the rotational symmetry of the removal profile. However, that can be at least partly remedied by an arrangement of a plurality of nozzles arranged obliquely and aligned exactly or approximately with a common processing point. The flow engineering design of the nozzle arrangement makes it possible to set diverse removal profiles in accordance with the processing demand.

All variants of the FJP method mentioned here are available as alternatives for the method according to the invention of geometry correction of the semiconductor wafer and in each case offer specific parameter values with regard to the removal rate, the removal profile and the achievable surface roughness. This variant shall be designated hereinafter in summary by the term "FJP method."

If the semiconductor wafer consists substantially of silicon, preferably a slurry of silicon oxide particles having a pH of between 7 and 11.5 is used as polishing agent. The proportion of the silicon oxide particles is preferably 0.1 to 2% (percent by weight). The copper content of the polishing agent is preferably a maximum of 0.04 ppm, and the nickel content is preferably a maximum of 0.1 ppm.

Since only a low material removal rate can be achieved with the FJP method, it is preferred not to treat an entire surface (preferably the front side) of the semiconductor wafer, but rather only the partial regions in which the value of the geometry parameter to be optimized turns out to be particularly poor. By way of example, the FJP processing can be restricted to the region adjoining the wafer edge, in order to improve the flatness in the edge region with regard to the parameter ESFQR. An FJP post-processing of the region of the laser marking is also preferred since this region often has a slight elevation after double-side polishing. The elevation can be leveled by means of an FJP processing restricted locally to the region of the laser marking.

After the FJP treatment, a renewed geometry measurement can be carried out for the purpose of process control.

Afterward, at least the side of the semiconductor wafer which was previously subjected to the FJP treatment is subjected to chemical mechanical polishing. In this case, the differences in roughness between the double-side-polished and FJP-treated regions are removed and the semiconductor wafer acquires a uniformly smooth surface polished in a haze-free manner. This polishing is preferably embodied as single-side polishing, wherein the material removal is preferably not more than 1 µm, and more preferably not more than 0.5 µm. A polishing machine comprising polishing heads having a plurality of rotationally symmetrical pressure zones, as described for example in EP847835A1, is preferably used for this purpose. This together with the small material removal enables substantial maintenance of the flatness set by means of FJP in the edge region of the semiconductor wafer.

Particularly preferred embodiments of the method according to the invention are described below:

A first particularly preferred embodiment is specifically adapted to improving the flatness in the edge region of the semiconductor wafer in order to optimize the parameter ESFQR.

In this embodiment, double-side polishing is preferably carried out such that the semiconductor wafer has the best possible global flatness (i.e. a low GBIR) with a slight elevation in the vicinity of the edge. The GBIR is preferably 200 nm and more preferably 150 nm. At the same time, a comparatively small edge roll-off should already be achieved by the double-side polishing, preferably $ESFQR_{avg}$ 40 nm and more preferably 30 nm.

This can be achieved for example by means of a suitable choice of the thickness of the carrier plates used for guiding the semiconductor wafers during the double-side polishing in relation to the final thickness of the polished semiconductor wafers: if the final thickness of the polished semiconductor wafers is smaller than the thickness of the carrier plates, then the polished semiconductor wafers have a slightly concave radial profile. An edge roll-off at the outermost edge, i.e. in the region of approximately 3 mm inward from the wafer edge, which limits the ESFQR values achievable by the double-side polishing, cannot be avoided in this case either. However, the double-side polishing is carried out such that this edge roll-off can be removed in the subsequent FJP step with the smallest possible material removal. The material removal during the double-side polishing is preferably 8-10 µm. Curve 1 in FIG. 1 shows a radial profile of this type such as is produced by the double-side polishing in this embodiment.

In the subsequent FJP step, it is merely necessary to carry out a geometry correction in the edge region. Since the region to be processed is rotationally symmetrical, it is preferred, during the FJP processing, to move the nozzle in one or more circular paths or spirally over the region to be processed. An FJP processing of the entire front side of the semiconductor wafer can be dispensed with in this embodiment. The elevation in the edge region is preferably removed by means of FJP with the smallest possible material removal to such an extent that the edge roll-off is completely removed and the radial profile as far as the outermost edge either is flat or rises uniformly. Curve 2 in FIG. 1 shows a profile corrected in this way by means of FJP. In the case illustrated, with a very small material removal in the FJP step of overall merely approximately 20 mm³, the flatness of the edge region can be improved such that an outstanding $ESFQR_{avg}$ value of 8 nm or less or even of 5 nm or less can be achieved. The $ESFQR_{avg}$ value can be reduced down to approximately 1 to 2 nm. The small material removal provides for a time- and hence cost-saving application of the FJP method.

Figure 2:
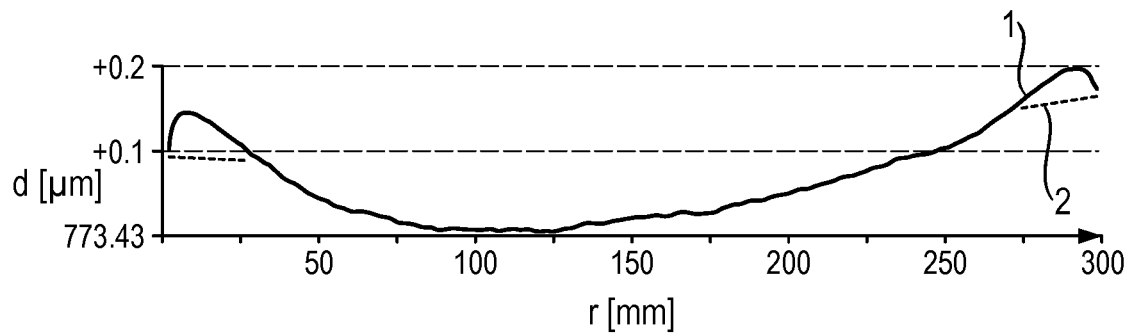
FIG. 2 shows another radial profile of the front side of a semiconductor wafer, the profile being produced by means of simultaneous double-side polishing, and also a profile produced therefrom by means of subsequent FJP processing.

In a second embodiment, the FJP processing is used to improve a profile that is not optimum after double-side polishing. By way of example, as a result of a non-optimum process implementation or on account of unintentional deviations during the double-side polishing, a slightly concave radial profile can arise which has a wider edge roll-off in comparison with the first particularly preferred embodiment. This edge roll-off is likewise completely removed by the subsequent FJP processing. In this embodiment, FJP is used for the post-processing of semiconductor wafers which would otherwise have to be rejected on account of deviations during the double-side polishing. For the rest, this embodiment does not differ from the first particularly preferred embodiment. FIG. 2 illustrates the radial profile before the FJP processing (curve 1) and after the FJP processing (curve 2). In this case, a significant improvement of the flatness in the edge region of the semiconductor wafer can already significantly improve the flatness of the edge region with a material removal of only 10 mm³, even if an outstanding $ESFQR_{avg}$ value of 8 nm or less is not achieved in this case.

In a third particularly preferred embodiment, the FJP method is used for removing an elevation at the location of the laser marking, the position and geometry of which can be ascertained after the double-side polishing. Elevations around the laser marking can arise because silicon and silicon oxide have different removal rates during double-side polishing. At the laser marking oxides can arise locally, which slow down material removal during double-side polishing and therefore remain as an elevation. In this case, too, only the region of the laser marking is processed, rather than the entire front side of the semiconductor wafer.

In a fourth particularly preferred embodiment, the FJP method is used for removing local disturbances of the surface. These disturbances may be e.g. local elevations that arise in the course of the deposition of a low temperature oxide (LTO) on the backside of the semiconductor wafer. They are referred to as so-called "spikes" and usually arise in the edge region of the semiconductor wafer. In order to be able to remove such local elevations that do not arise reproducibly at the same location, each semiconductor wafer must be subjected to a geometry measurement before the FJP step is carried out.

The above description of exemplary embodiments should be understood to be by way of example. The disclosure thus provided firstly enables the person skilled in the art to understand the present invention and the advantages associated therewith, and secondly, within the understanding of the person skilled in the art, also encompasses obvious alterations and modifications of the structures and methods described. Therefore, all such alterations and modifications and equivalents are intended to be covered by the scope of protection of the claims.

The invention claimed is:

1. A monocrystalline semiconductor wafer having a front side, a back side, and an edge, and having, on the front side, an average roughness $R_a$ of at most 0.8 nm at a limiting wavelength of 250 μm, and an $ESFQR_{avg}$ of 8 nm or less given an edge exclusion of 1 mm.

2. The monocrystalline semiconductor wafer of claim 1, wherein the $ESFQR_{avg}$ is 5 nm or less.

3. The monocrystalline semiconductor wafer of claim 2, wherein the contents of copper and nickel, determined by means of poly-UTP are each at most $3 \times 10^{10}$ cm$^{-2}$.

4. The monocrystalline semiconductor wafer of claim 1, wherein the contents of copper and nickel, determined by means of poly-UTP are each at most $3 \times 10^{10}$ cm$^{-2}$.

5. The monocrystalline semiconductor wafer of claim 1, wherein the semiconductor wafer consists substantially of silicon.

6. The monocrystalline semiconductor wafer of claim 5, which has a diameter of at least 300 mm.

7. The monocrystalline semiconductor wafer of claim 1, wherein the average front side surface roughness Ra at a limiting wavelength of 250 μm is between 0.1 nm and 0.2 nm.

8. A method for producing a monocrystalline semiconductor wafer having a front side, a back side, and an edge, comprising the following steps in the indicated order:
 a) simultaneous double-side polishing of the semiconductor wafer to produce polished front side and back side surfaces,
 b) local material-removing processing of at least part of at least the front side surface of the semiconductor wafer using a fluid jet which contains suspended hard substance particles and which is directed onto a small region of the surface with the aid of a nozzle, wherein the nozzle is moved over that part of the surface which is to have material removed, in such a way that a predefined geometry parameter of the semiconductor wafer is improved, and
 c) polishing at least the front side surface of the semiconductor wafer,
wherein the front side has an average roughness Ra of at most 0.8 nm at a limiting wavelength of 250 μm, and an $EFSQR_{avg}$ of 8 nm or less given an edge exclusion of 1 mm.

9. The method of claim 8, wherein the local material-removing processing is carried out after a location-dependent measurement of the geometry parameter measured after the simultaneous double-side polishing of the same semiconductor wafer.

10. The method of claim 9, wherein the local material-removing processing is carried out on the basis of a known location-dependent measurement of the geometry parameter measured after an identical simultaneous double-side polishing of identical semiconductor wafers, without the semiconductor wafer that is to be treated itself being subjected to this measurement.

11. The method of claim 10, wherein the geometry parameter is the parameter ESFQR.

12. The method of claim 9, wherein the geometry parameter is the parameter ESFQR.

13. The method of claim 8, wherein the geometry parameter is the parameter ESFQR.

14. The method of claim 8, wherein the material-removing processing is carried out by means of a nozzle which is guided over the surface to be processed at a distance of 0.5 to 3 mm from the surface and through which the fluid jet comprising the suspended hard substance particles emerges, fluid accumulates between the nozzle and the surface, and wherein the material removal is predominantly achieved by fluid comprising suspended hard substance particles that flows out parallel to the surface between the surface and the edge of the nozzle.

15. The method of claim 8, wherein not more than 1 μm of material is removed in the final polishing of the front side surface of the semiconductor wafer in step c).

16. The method of claim 8, wherein during the simultaneous double-side polishing of the semiconductor wafer is produced with a profile having a defined elevation in a region in the vicinity of an edge of the wafer.

17. The method of claim 16, wherein during the local material-removing processing the nozzle is guided in circular paths or spirally over the region in the vicinity of the edge in which the elevation is situated, such that the elevation is at least partly removed during the course of the local material-removing processing.

18. The method of claim 8, wherein not more than 0.5 μm of material is removed in the final polishing of the front side surface of the semiconductor wafer in step c).

* * * * *